United States Patent [19]

Inai

[11] Patent Number: 5,640,022
[45] Date of Patent: Jun. 17, 1997

[54] QUANTUM EFFECT DEVICE

[75] Inventor: Motohiko Inai, Tsukuba, Japan

[73] Assignee: Sanyo Electric Co., Inc., Osaka, Japan

[21] Appl. No.: 296,319

[22] Filed: Aug. 25, 1994

[30] Foreign Application Priority Data

Aug. 27, 1993 [JP] Japan ................................ 5-212947
Aug. 9, 1994 [JP] Japan ................................ 6-187435

[51] Int. Cl.$^6$ .......................... H01L 29/08; H01L 29/778
[52] U.S. Cl. ........................... 257/26; 257/24; 257/29; 257/194; 257/14; 333/103
[58] Field of Search ................................ 257/14, 24, 26, 257/194, 29; 333/103

[56] References Cited

U.S. PATENT DOCUMENTS 5,350,931  9/1994  Flanny et al. ........................... 257/14
5,369,288  11/1994  Usuki ........................................ 257/26

OTHER PUBLICATIONS

Ismail, K., et al., "Surface-superlattice effects in a grating-gate GaAs/GaAlAs modulation doped field-effect transistor", Appl. Phys. Lett. 52(13), Mar. 28, 1988, pp. 1071–1073.

Sols, Fernando, et al., "Theory for a quantum modulated transistor", J. Appl. Phys. 66(8), Oct. 15, 1989, pp. 3892–3907.

Primary Examiner—Jerome Jackson
Assistant Examiner—John Gray
Attorney, Agent, or Firm—Loeb & Loeb LLP

[57] ABSTRACT

A quantum effect device which operates in a mesoscopic region and eliminates the need for making monochromatic electron waves for the operation and moreover can operate in a high temperature region. The quantum effect device comprises a first waveguide for connecting a first region and a second region, wherein carriers are injected into the first region and emitted from the second region, a second waveguide being branched off from the center of the first waveguide and connected to a third region, and a control region being formed in the branch part of the first and second waveguides for controlling a potential barrier. When the potential barrier is low, the control region emits carriers on the first waveguide from the second region and when the potential barrier is high, the control region leads carriers into the second waveguide from the first waveguide by quantum-mechanical reflection for emitting the carriers from the third region. The quantum effect device further includes a carrier injection region formed using a single potential barrier or resonant tunneling structure between the first region and the control region for speeding up the operation.

28 Claims, 13 Drawing Sheets

22 / 21 / 20

22 / 21 / 20

QUANTUM EFFECT DEVICE

BACKGROUND OF THE INVENTION

1. Field of the Invention

This invention relates to a quantum effect device and more particularly to a quantum effect device which operates in a mesoscopic region and eliminates the need for making monochromatic electron waves for the operation and moreover can operate in a high temperature region (at up to room temperature).

2. Description of the Related Art

Up to now, various quantum effect devices have been proposed, such as quantum effect devices using the Bragg reflection and diffraction effects, quantum effect devices of the A-B (Aharonov-Bohm) effect, type, and quantum effect devices of the stub type. The interference or diffraction effect of electron waves is used for the operation principles of the quantum effect devices.

In the quantum effect devices using the Bragg reflection and diffraction effects, the number of effective periodic potentials sensed within the phase breaking time due to inelastic scattering is limited. Thus, the quantum effect devices have good characteristics expected only in a very low temperature area with a long phase breaking time.

In the quantum effect devices of the A-B effect type, it is difficult to equally divide electron waves. Moreover, the switching characteristic of the quantum effect device of the A-B effect type appears periodically for a gate input and has a small operation margin.

Further, in the quantum effect devices using the interference effect produced by the device form, such as the quantum effect devices of the stub type, it is necessary to make electron waves monochromatic in order to for observe the operation. Thus, the necessity for cooling the quantum effect device to a very low temperature, etc., arises.

SUMMARY OF THE INVENTION

It is therefore an object of the invention to provide a quantum effect device which operates in a mesoscopic region and eliminates the need to make monochromatic electron waves for the operation, and moreover can operate in a high temperature region.

To these ends, according to the invention, there is provided a quantum effect device comprising a first waveguide for connecting a first region and a second region, wherein carriers are injected into the first region and emitted from the second region, a second waveguide being branched off from the center of the first waveguide and connected to a third region, wherein the injected carriers are emitted from the third region and a control region being formed in the branch part of the first and second waveguides for controlling a potential barrier. When the potential barrier is low, the control region emits carriers on the first waveguide from the second region; when the potential barrier is high, the control region leads carriers into the second waveguide from the first waveguide by quantum-mechanical reflection to emit the carriers from the third region. First, the quantum effect device according to the invention, which uses the quantum-mechanical reflection effect of electrons produced by a gate potential barrier, can shorten the coherence length required for the operation and can operate in a high temperature region. Second, the quantum effect device eliminates the need for electron waves to be monochromatic, and so it does not require any additional structure for making monochromatic electron waves; it also eliminates the need for cooling to very low temperature. Third, the quantum effect device, which does not contain any object suppressing a carrier flow, such as a potential barrier, between the first region and the control region of the first waveguide, can increase operation current and improve drivability of a device at the following stage.

The second waveguide is branched off at an angle from the first waveguide. Thus, the second waveguide need not necessarily be perpendicular to the first waveguide and therefore design freedom of the quantum effect device can be made large without affecting the basic operation characteristics of the quantum effect device.

The second waveguide is branched off to a carrier injection side of the first waveguide at an angle. Thus, the current branching ratio when zero bias is applied to the control area can be Improved compared with the structure in which the second waveguide is branched off to a carrier emission side of the first waveguide at an acute angle.

The second waveguide is branched off perpendicularly to the first waveguide.

The first and second waveguides are formed on the same horizontal plane. This structure enables the first and second waveguides to be formed on a single crystal layer during a semiconductor manufacturing process, thus carrier scattering can be decreased on the first and second waveguides to improve ballistic characteristics of carriers.

The first and second waveguides are formed on the same vertical plane.

The quantum effect device includes a first waveguide, having a control region, a source region and a drain region, and a second waveguide. A first portion of the first waveguide, from the control region to the drain region, is made of a substrate or thin film. A second portion of the first waveguide, from the control region to the source region, is made of a quantum wire waveguide. Thus, the quantum wire waveguide can be drawn out as a simple structure connecting the quantum wire waveguide to the second waveguide, in a direction perpendicular to the second waveguide. As a result, the quantum effect device having the quantum wire waveguide structure can be easily provided.

A plurality of the second waveguides are branched off, in parallel, from the first waveguide, and control regions for separately controlling potential barriers are provided in branch parts of the second waveguides. Thus, carriers not led into the second waveguide by the quantum-mechanical reflection of the potential barrier and clearing the potential barrier in the preceding branch part on the side of the first source region are led into the second waveguide by the quantum-mechanical reflection in the following branch part, so that the total amount of carriers emitted from the third region can be increased. As a result, the current branching ratio in the quantum effect device can be Improved overall, leading to improvement in drivability. Therefore, the quantum effect device enables low voltage operation.

The first and second waveguides are provided by an electron conduction layer of a two-dimensional electron gas formed on a heterojunction interface of a compound semiconductor. The manufacturing process of compound semiconductors is established to some degree and a good heterojunction interface with low crystal discontinuity can be formed, thus the scattering of carriers can be decreased on the electron conduction layer of the two-dimensional electron gas. Further, the electron conduction layer of the two-dimensional electron gas is used for the first and second waveguides, thus, high carrier mobility is provided. That is, ballistic carriers can be used in the quantum effect device.

The first and second waveguides are provided by an electron conduction layer of a two-dimensional electron gas formed on a heterojunction interface between GaAs and AlGaAs. The manufacturing process of each of GaAs and AlGaAs among compound semiconductors is very well established and a heterojunction interface having a superior and stable band gap with extremely low crystal discontinuity can be formed, thus scattering of carriers can be substantially decreased on the electron conduction layer of the two-dimensional electron gas. Further, high electron mobility is provided on the electron conduction layer of the two-dimensional electron gas.

The first and second waveguides are provided by an electron conduction layer of a two-dimensional electron gas formed on a heterojunction interface between InGaAs and InP. Like the GaAs type materials, the manufacturing process of InGaAs and InP among compound semiconductors is very well established and a heterojunction interface having a superior and stable band gap with extremely low crystal discontinuity can be formed, so that the scattering of carriers can be substantially decreased on the electron conduction layer of the two-dimensional electron gas. Further, high electron mobility is provided on the electron conduction layer of the two-dimensional electron gas as compared with the GaAs type materials.

Schottky junction structures or MIS (metal insulator semiconductor) structures are formed around the first and second waveguides and depletion regions formed in the Schottky junction structures or MIS capacitance structures determine the widths of the first and second waveguides. Thus, the widths of the first and second waveguides are defined by the depletion regions which make a smooth interface with each of the first and second waveguides, rather than by a physical process generating microscopic Irregularities. As a result, scattering of carriers can be reduced on the first and second waveguides.

The surroundings of the first and second waveguides are formed as concave portions, as a result of forming a depletion layer on crystal damage regions on the etched wall faces, which resulted from etching, and these concave portions determine the widths of the first and second waveguides. Thus, the depletion regions formed by the crystal damage regions on the wall faces of the concave portions make smooth interfaces with the first and second waveguides. Therefore, in the quantum effect device, scattering of carriers can be reduced on the first and second waveguides.

Concave portions are formed around the first and second waveguides and are filled in with filler material. Thus, the exposed wall faces of the first and second waveguides when the concave portions are formed are restored to a form close to that of a perfect lattice by filling in with the filler material. Therefore, the crystal surface level of the wall face of each of the first and second waveguides is stabilized and electrical conductivity can be recovered on the first and second electron waveguides. If material homogeneous to either of the first and second waveguides, for example, compound semiconductor, is used as the filler material and furthermore annealing capable of recovering the crystal damage regions is performed after the concave portions are filled in with the compound semiconductors as the filler material, recovery of electrical conductivity of the first and second waveguides can be further improved.

Crystal damage regions are formed around the first and second waveguides by introducing Impurities and depletion regions formed by the crystal damage regions determine widths of the first and second waveguides. Thus, the depletion regions formed by the crystal damage regions make smooth interfaces with the first and second waveguides. Therefore, in the quantum effect device, scattering of carriers can be reduced on the first and second waveguides. Further, the impurities are introduced to form the crystal damage regions for forming the first and second waveguides rather than the surroundings of the first and second waveguides using processing a physical process. Therefore, flattening of the surface can be promoted in the quantum effect device.

An overlap of the control region with the first waveguide is formed as a right angled triangle, and a potential barrier is generated along the hypotenuse of the right angled triangle, which acts as a quantum-mechanical reflection. Thus, the width of the waveguide leading into the second waveguide from the first waveguide (the waveguide width in the branch part) can be provided sufficiently, so that carriers can be made to flow smoothly into the second waveguide from the first waveguide by the quantum-mechanical reflection of the potential barrier. As a result, the current branching ratio can be improved in the quantum effect device.

An overlap of the control region with the first waveguide is formed as a quadrangle. Using this construction, since the length of the control region can be guaranteed in the longitudinal direction of the first waveguide, carriers passing through the control region (potential barrier) to the side of the second region can be decreased when carriers are made to flow into the second waveguide from the first waveguide by the quantum-mechanical reflection of the potential barrier. As a result, the current branching ratio can be improved in the quantum effect device.

An overlap of the control region with the first waveguide is formed as a trapezoid containing a slant side generating a potential barrier acting as a quantum-mechanical reflection face. Thus, the width of the waveguide leading into the second waveguide from the second waveguide can be provided sufficiently, so that carriers can be made to flow smoothly into the second waveguide from the first waveguide by the quantum-mechanical reflection of the potential barrier. Further, using this construction, since the length of the control region can be generated in the longitudinal direction of the first waveguide, carriers passed through the control region (potential barrier) to the side of the second region can be decreased when carriers are made to flow into the second waveguide from the first waveguide by the quantum-mechanical reflection of the potential barrier. As a result, the current branching ratio can be further improved in the quantum effect device.

A quantum-mechanical reflection face formed by the potential barrier generated in the control region is disposed within the width of the second waveguide in the first waveguide. Thus, when a voltage for generating the quantum-mechanical reflection face by the potential barrier is applied to the control region, carriers flowing into the first waveguide are led into the second waveguide, and thus a current modulation characteristic can be provided under the voltage control in the quantum effect device. This means that the quantum effect device provides a volt-ampere characteristic similar to that of a MESFET (metal Schottky field effect Transistor).

A quantum-mechanical reflection face formed by the potential barrier generated in the control region is disposed on the side of the second region of the first waveguide outside the width of the second waveguide in the first waveguide. Thus, in the quantum effect device, carriers, once they have passed through the branch part of the first and second waveguides, reach the quantum-mechanical reflection face formed by the potential barrier generated in the control region. Although carriers reflected on the quantum-mechanical reflection face and led into the second waveguide exist, the number of carriers penetrating the potential barrier generated in the control region, moving straight on the first waveguide, and emitted from the second region increases. That is, the quantum effect device provides not only a switching characteristic, but also the volt-ampere characteristic similar to that of a diode.

The full length of the first waveguide is set to 100 nm or less and the width of the first waveguide is set to 100 nm or less. Thus, the quantum effect device can be provided within the range of the coherence length in which the quantum effect device can operate at room temperature (about 300 degrees K) or less.

Ballistic carriers are injected into the control region. Using this construction, the ballistic carriers have high energy and the carrier flow can be accelerated, so that the operation of the quantum effect device can be made faster.

The quantum effect device further includes a carrier injection region formed with a single potential barrier or resonant tunnel structure between the first region and the control region of the first waveguide, for injecting ballistic carriers into the control region by tunnel injection. Thus, carriers having low energy are excluded by the potential barrier in the carrier injection region and ballistic electrons having high energy are injected into the control region by tunnel injection. Using this construction, the ballistic carriers have high energy and carrier flow can be accelerated, so that the operation of the quantum effect device can be made faster.

DESCRIPTION OF THE PREFERRED EMBODIMENTS

Referring now to the accompanying drawings, there are shown preferred embodiments of the invention.

Embodiment 1

Figure 1:
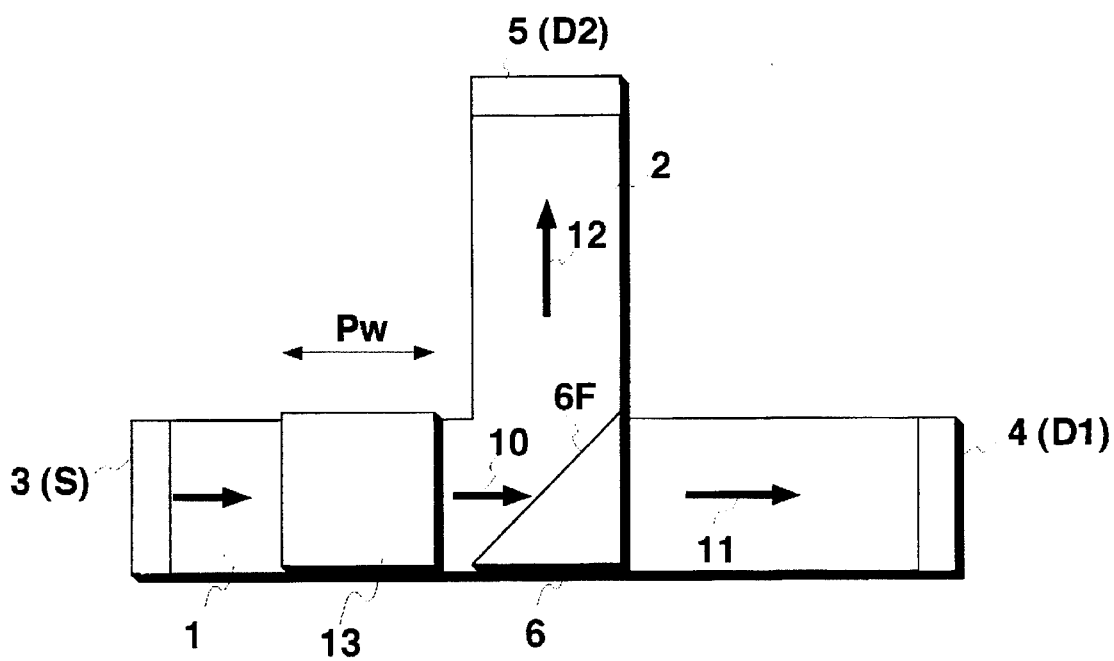
FIG. 1 is a plan view of a first basic structure of a quantum effect device according to a first embodiment of the invention.
Figure 2:
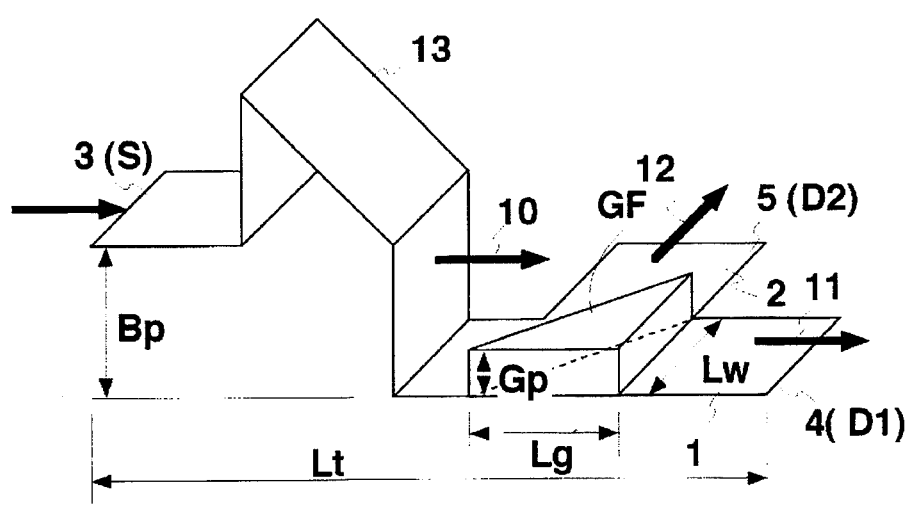
FIG. 2 is a basic structure modeling drawing of the quantum effect device shown in FIG. 1.

First basic structure and operation principle of quantum effect device:

FIG. 1 is a plan view Illustrating a first basic structure of a quantum effect device according to a first embodiment of the invention. FIG. 2 is a basic structure modeling drawing showing the relationship between the quantum effect device and potential energy.

As shown in FIGS. 1 and 2, the quantum effect device consists essentially of an electron waveguide 1, a branch electron waveguide 2, a source region (S) 3, a first drain region (D1) 4, a second drain region (D2) 5, a gate region (control region) 6, and an electron injection region (electron injection structure) 13.

The quantum effect device is made of GaAs and AlGaAs in the embodiment. The electron waveguide 1 and the branch electron waveguide 2 are formed by an electron conduction layer of a two-dimensional electron gas family generated in the vicinity of a heterojunction interface between GaAs and AlGaAs. The effective mass of an electron (minority carrier) is 0.067 me. The electrode regions are maintained at a higher temperature than very low temperature regions. For example, the quantum effect device is cooled to liquid nitrogen temperature and the electrodes in the regions are maintained at the temperature of 77 degrees K.

The electron waveguide 1 has one end connected to the source region 3 and the other end connected to the first drain region 4. The electron waveguide 1 is branched off at the center and one end of the branch electron waveguide 2 is connected to the branch part of the electron waveguide 1. The branch electron waveguide 2 has the other end connected to the second drain region 5. In the quantum effect device according to the embodiment, the center axis of the branch electron waveguide 2 is perpendicular—at right angles (90 degrees)—to the center axis of the electron waveguide 1 (the branch electron waveguide 2 is branched off at right-angles to the electron waveguide 1), making a T-shaped form.

The gate region 6 is formed in the branch part of the electron waveguide 1 and the branch electron waveguide 2. In the gate region 6, a gate potential barrier Gp can be controlled in response to an applied voltage, as shown in FIG. 2. If the gate potential barrier Gp is controlled so as to be low, electron flow (electron wave) 10 injected through the electron injection region 13 from the source region 3 clears the gate potential barrier Gp and is transferred as a passed electron flow 11 to the electron waveguide 1 for emitting electrons from the first drain region 4. If the gate potential barrier Gp is controlled so as to be high, an electron flow 10 injected by the quantum-mechanical reflection of the gate potential barrier Gp is reflected and is transferred as a reflected electron flow 12 to the branch electron waveguide 2 for emitting electrons from the second drain region 5. On a quantum-mechanical reflection face GF formed by the gate potential barrier Gp, the incidence angle with the injected electron flow 10 and the reflection angle with the reflected electron flow 12 are each 45 or 135 degrees.

The overlap of the gate region 6 with the electron waveguide 1 is formed as a right-angled triangle, the hypotenuse of which acts as a quantum-mechanical reflection face GF under control of the gate potential barrier Gp. If the gate region 6 is formed as a triangle, the waveguide width leading into the branch electron waveguide 2 from the electron waveguide 1 (waveguide width of the branch part) can be provided sufficiently. That is, the current branching ratio can be improved because an electron flow into the branch electron waveguide 2 from the electron waveguide 1 caused by the gate potential barrier Gp acting as a the quantum-mechanical reflection can be made smooth.

Further, in the gate region 6, the quantum-mechanical reflection face GF formed by the gate potential barrier Gp is located within the width of the branch electron waveguide 2 within the electron waveguide 1. When voltage for generating the quantum-mechanical reflection face GF by the gate potential barrier Gp is applied to the gate region 6, an electron flow 10 into the electron waveguide 1 is led into the branch electron waveguide 2 at the branch point, so that a current modulation characteristic is provided under the voltage control in the quantum effect device.

The electron injection region 13 is disposed between the source region 3 and the gate region 6 on the electron waveguide 1. The electron injection region 13 is formed using a single potential barrier. For example, the potential barrier is set to 0.1 eV and width Pw is set to 4 nm. In the electron injection region 13, electrons having low energy are excluded by the potential barrier and ballistic electrons having high energy are injected into the gate region 6 (as tunnel current or injected electron flow 10) by tunnel injection.

Since the device size of the quantum effect device is sufficiently small, the ballistic electron flow 10 having high energy in the electron injection region 13 can be injected into the gate region 6. As a result, even if electrons having comparatively high energy of 10–100 meV are injected from the source region 3, there is a low probability of the occurrence of inelastic scattering caused by an optical phonon or inelastic scattering between electrons in the gate region 6. Therefore, an electron wave (electron flow) flowing into the device can be controlled by controlling the phase breaking time using temperature control, etc., (controlling the phase breaking time to 1.0 psec in the embodiment) so that the electron wave (electron flow) is coherent over the gate region 6.

In the quantum effect device in the embodiment, for example, the waveguide length Lt of the electron waveguide 1 shown in FIG. 2 is set to 40 nm, the waveguide width of the electron waveguide 1 (width of the gate region 6), Lw, is set to 10 nm, and the maximum length Lg of the gate region 6 is set to 10 nm. To set the gate length within the range of the coherence length to enable the quantum effect device to operate at room temperature (about 300 degrees K), the waveguide length Lt of the electron waveguide i is set to 100 nm or less and the waveguide width Lw of the electron waveguide 1 is set to 100 nm or less. Reference symbol Bp in FIG. 2 is a bias potential.

The operation principle of the quantum effect device is described below:

(1) Electrons having high energy are injected into the gate region 6 through the electron waveguide 1 from the source region 3 of the quantum effect device.

(2) Some of the injected electrons (electron flow 10) are reflected by the quantum-mechanical reflection of the gate potential barrier into the branch part of the electron waveguide 1, namely, into the intersection of the electron waveguide 1 and the branch electron waveguide 2.

(3) At this time, if the maximum length Lg of the gate region 6 is about 10 nm, for example, ballistic conduction dominates over the electron flow 10. That is, when the gate potential barrier Gp is low, a small number of electrons are diverted from the electron waveguide 1 to the branch electron waveguide 2 and most of the electrons penetrate the gate potential barrier Gp and emitted from the first drain region 4 as a passed electron flow 11.

(4) As the gate potential barrier Gp is increased, electrons diverted from the electron waveguide 1 to the branch electron waveguide 2 increase. That is, the electron flow 10 injected into the electron waveguide 1 is reflected to the branch electron waveguide 2 by the quantum-mechanical reflection of the gate potential barrier Gp and the electrons are emitted from the second drain region 5 as a reflected electron flow 12.

(5) Further, when the gate potential barrier Gp becomes sufficiently high, almost all electrons are reflected quantum-mechanically and diverted from the electron waveguide 1 to the branch electron waveguide 2 and are emitted from the second drain region 5 as the reflected electron flow 12. At this time, the number of reflected electrons reaches saturation and the current value also reaches saturation.

Figure 3:
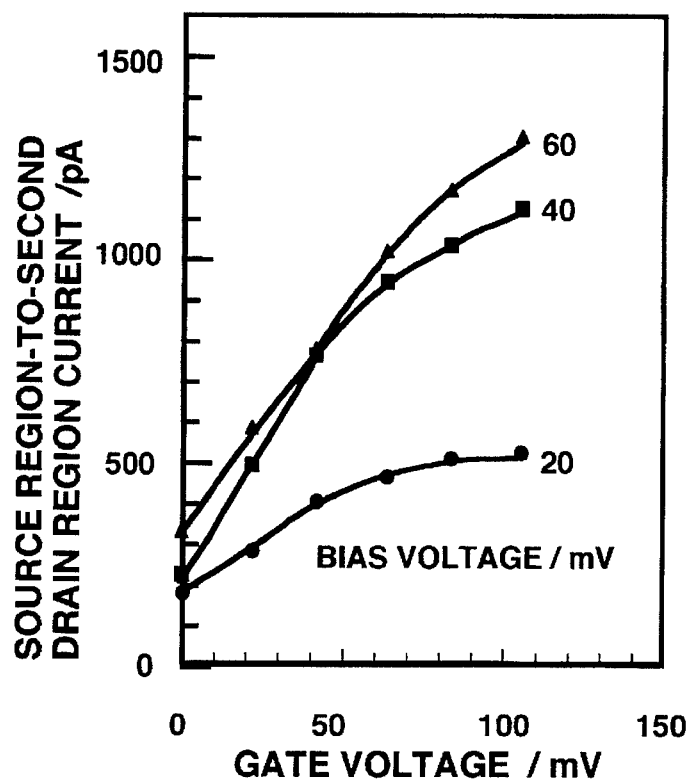
FIG. 3 is a volt-ampere plot of the quantum effect device shown in FIG. 1.
Figure 4:
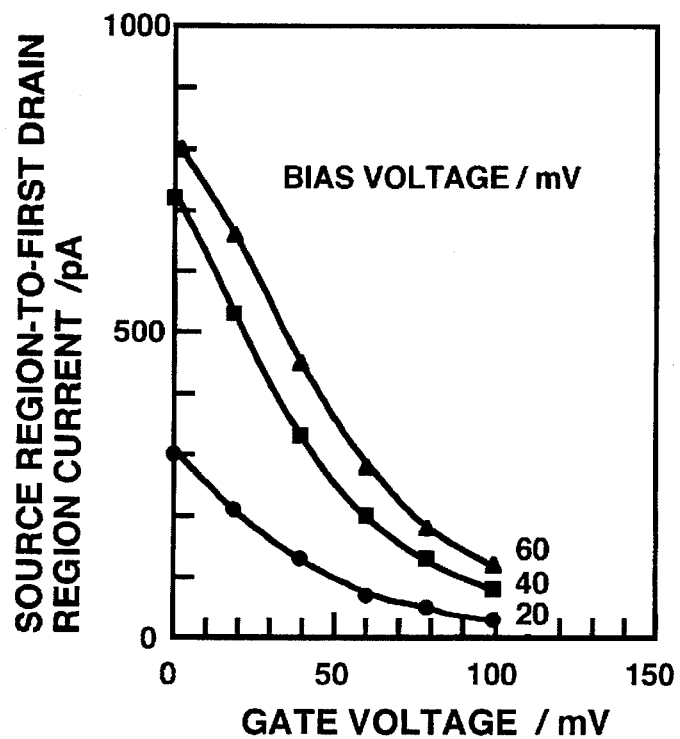
FIG. 4 is a volt-ampere plot of the quantum effect device shown in FIG. 1.

FIGS. 3 and 4 show the volt-ampere characteristics (I-V characteristics) obtained by simulation for the quantum effect device. FIG. 3 shows the source region 3 to second drain region 5 current (source to drain current) values with respect to the voltage (gate voltage) values applied to the gate region 6. FIG. 4 shows the source region 3 to first drain region 4 current values with respect to the voltage values applied to the gate region 6.

As shown in FIG. 3, the quantum effect device provides the characteristic having a nonlinear region in which current increases due to the quantum-mechanical reflection with an increase in voltage and a saturation region in which current does not increase although voltage increases. In this point, the quantum effect device provides an operation characteristic approximating to a switching device such as a MOSFET (metal oxide semiconductor field effect transistor) or MESFET.

Further, as shown in FIG. 4, it can be acknowledged that in the quantum effect device current decreases with an increase in voltage and quantum-mechanical refection occurs.

Figure 5:
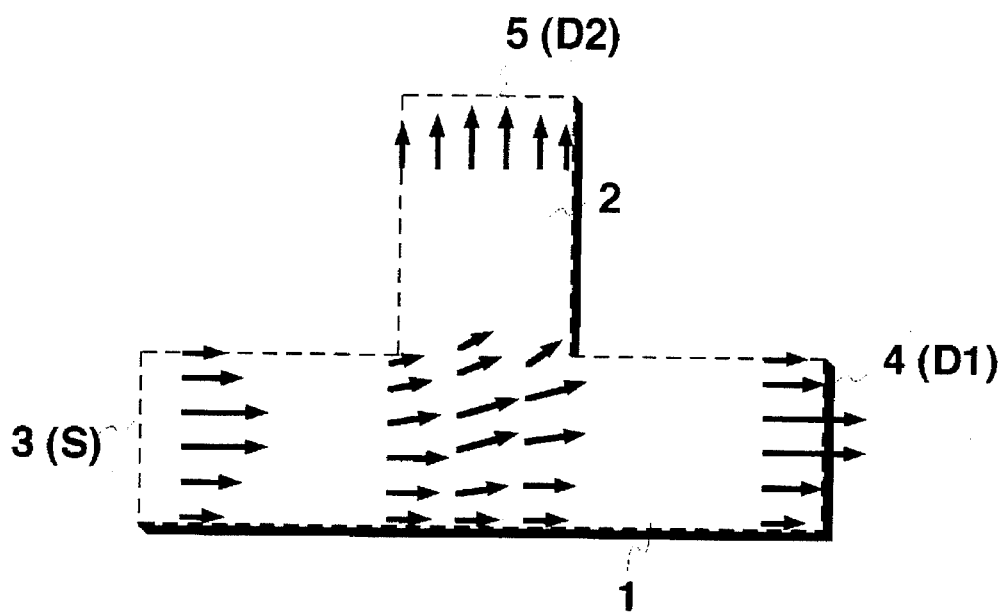
FIG. 5 is a current distribution chart in the quantum effect device shown in FIG. 1.

FIG. 5 is a current distribution chart drawn by extracting only a part of current distribution in the quantum effect device. The arrows shown in FIG. 5 denote electron flows. The electric current flow direction is opposed to the electron flow direction.

The quantum effect device in the embodiment is similar in structure to a quantum effect device of QMT (quantum modulated transistor) type produced by F.Sols and associates. However, the quantum effect device of the QMT type differs from the quantum effect device of the invention in structure and principle operation. That is, the former has a depletion region at the termination of a waveguide corresponding to the branch electron waveguide 2 of the latter and no current flows.

Thus, the quantum effect device in the embodiment uses the quantum-mechanical reflection effect of electrons, produced by the gate potential barrier Gp, and the coherence length required for the operation can be shortened to about the maximum length Lg of the gate region 6, specifically, about 10 nm, so that the quantum effect device can operate in a substantially high temperature region (77 degrees K or higher).

Further, the quantum effect device does not require that electron waves be monochromatic, and thus does not require any additional structure for making monochromatic electron waves. <Second basic structure and operation principle of quantum effect device>

Next, a second basic structure of the quantum effect device is described with reference to FIG. 6, a basic structure modeling drawing represented as the relationship with potential energy. The quantum effect device of the second basic structure has a feature of being capable of increasing an operation current.

Figure 6:
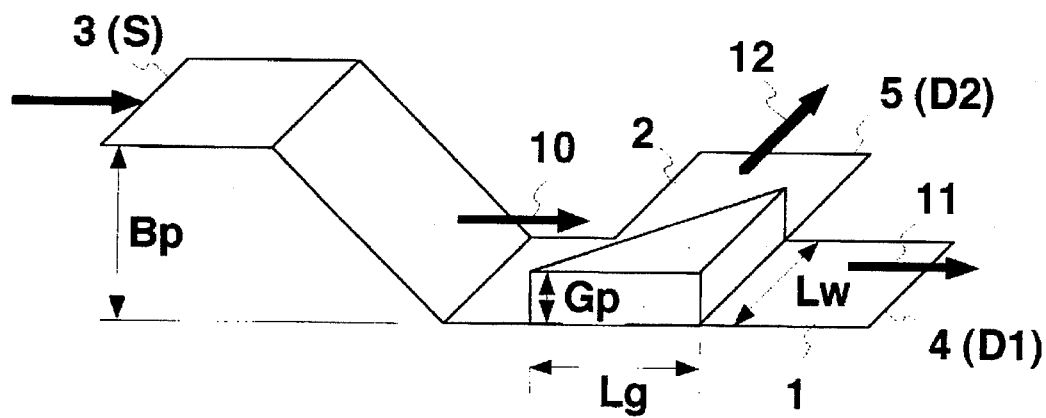
FIG. 6 is a basic structure modeling drawing of a second basic structure of the quantum effect device according to the first embodiment of the invention.

As shown in FIG. 6, the quantum effect device discussed here has the same basic structure as the quantum effect device described above except that it does not have the electron injection region 13 on the source region 3 side of the electron waveguide 1 described above, thus simplifying the structure. The electron injection region 13 is formed by a potential barrier and electrons (electron flow 10) are injected into the gate region 6 by the tunnel effect. If the electron injection region 13 is omitted, the operation current of the quantum effect device can be increased. That is, the quantum effect device formed as the second basic structure, which can increase the operation current, can improve the ability of driving a device at the following stage. Also, with this quantum effect device, the operation of the device at the following stage can be speeded up.

Figure 7:
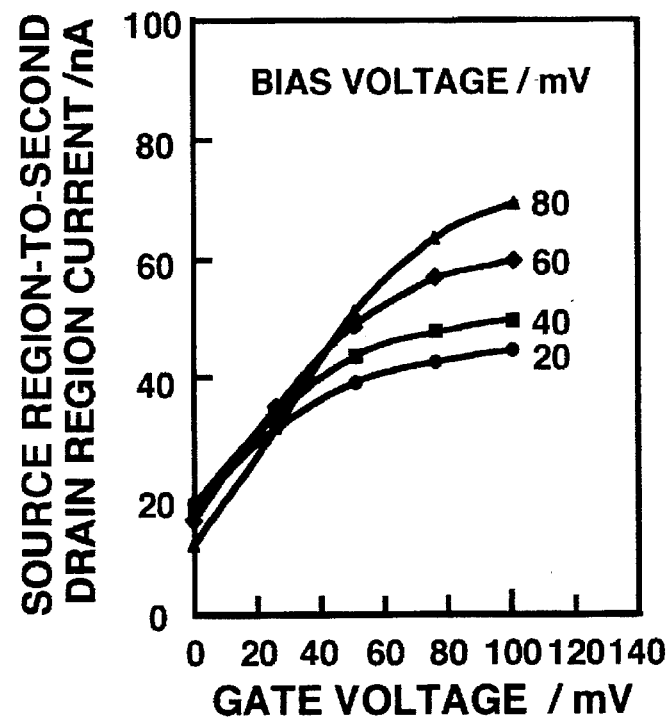
FIG. 7 is a volt-ampere plot of the quantum effect device shown in FIG. 6.

FIG. 7 shows the volt-ampere characteristic (I-V characteristic) obtained by simulation for the quantum effect device formed as the second basic structure. FIG. 7 shows the source region 3 to second drain region 5 current (source to drain current) values with respect to the voltage (gate voltage) values applied to the gate region 6. The quantum effect device formed as the second basic structure can increase the operation current by about several ten times that of the quantum effect device formed as the first basic structure. <Operation characteristic improvement of quantum effect device>

In the quantum effect devices formed as the first and second basic structures, an offset current exists even when the voltage applied to the gate region 6 (gate voltage) is 0 V. The dimensions of the device structure and the energy amount of electrons to be injected (bias voltage) are optimized to reduce the offset current.

Figure 8:
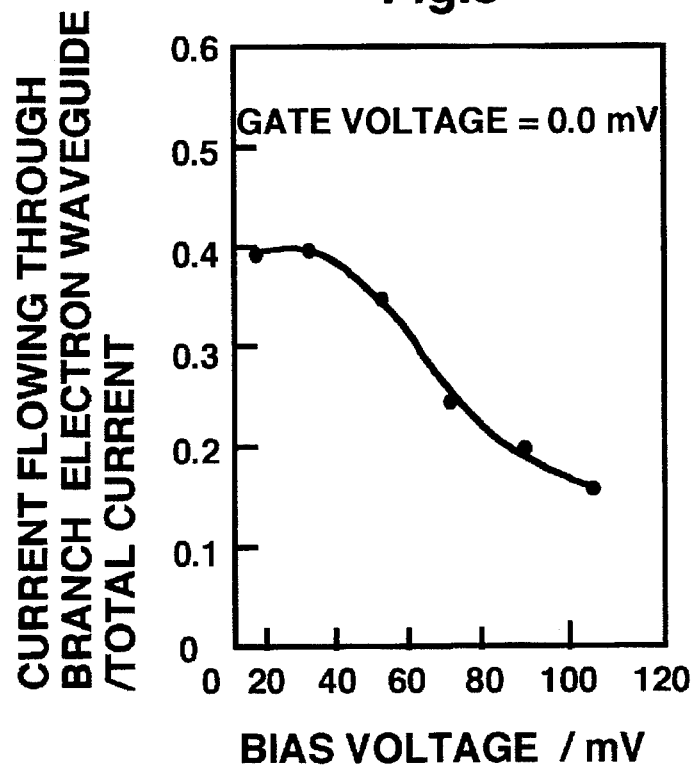
FIG. 8 is a chart showing the relationship between bias voltage and current ratio at the quantum effect device shown in FIG. 6.

FIG. 8 shows change in the ratio of current flowing through the branch electron waveguide 2 to total current, as the bias voltage (energy of injected electrons) is changed when the gate voltage is 0 V at the quantum effect device formed as the second basic structure. As shown in FIG. 8, the current ratio is saturated at about 0.15 as the bias voltage increases. When the bias voltage decreases to 0 V, the current ratio converges on 0.4 and does not reach 0.5. Such a characteristic is thought of as the quantum-mechanical effect. The offset current can be prevented from occurring with the quantum effect device by controlling the current ratio to be smaller. <Specific structure of quantum effect device>

Figure 9:
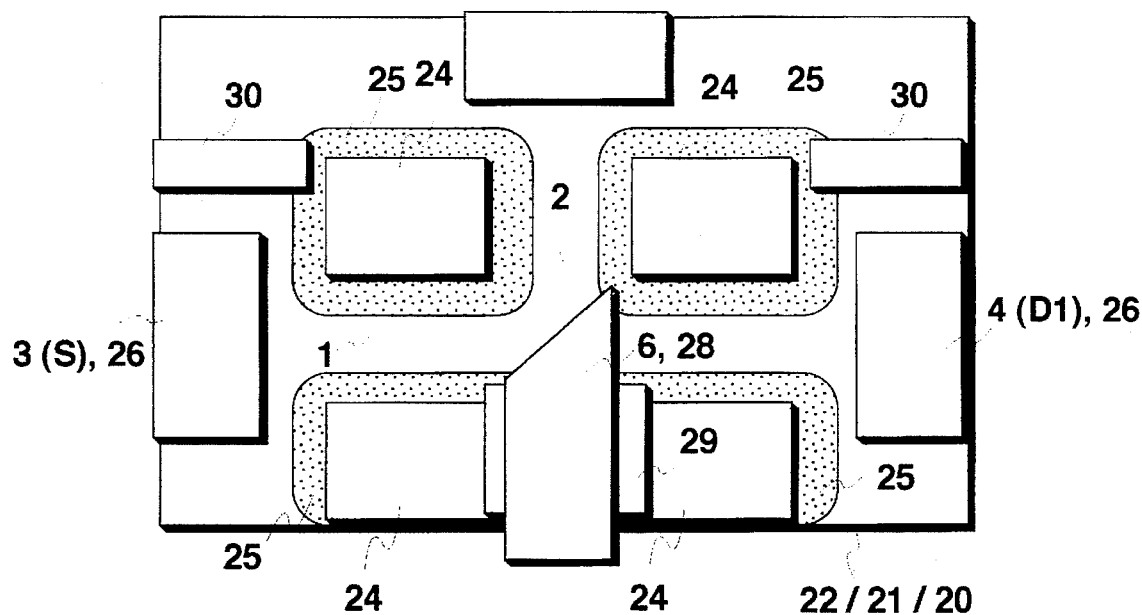
FIG. 9 is a plan view showing a specific structure of the quantum effect device shown in FIG. 6.
Figure 10:
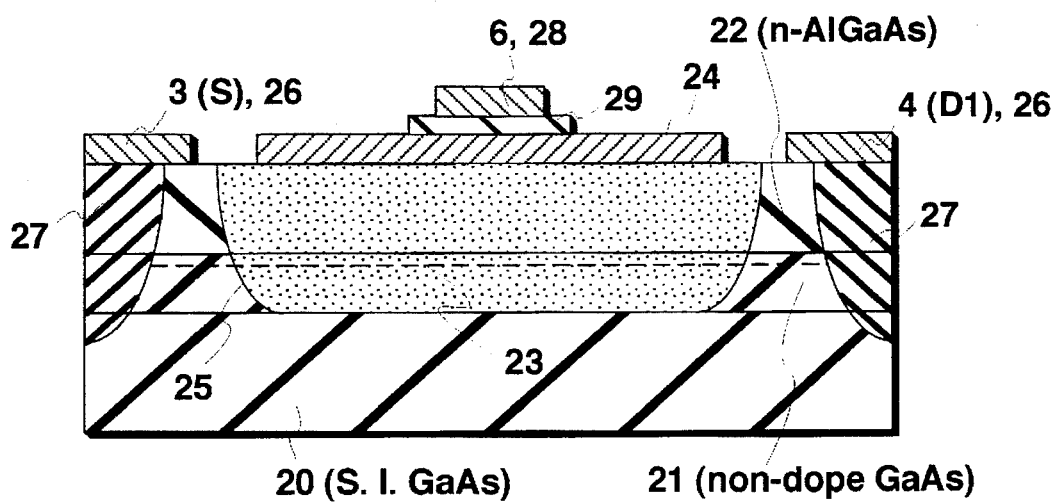
FIG. 10 is a sectional view showing the specific structure of the quantum effect device shown in FIG. 9.

FIG. 9 is a plan view of a specific quantum effect device formed based on the second basic structure and FIG. 10 is a sectional view thereof.

As shown in FIGS. 9 and 10, the quantum effect device uses a semi-insulating substrate 20 made of GaAs. Non-doped GaAs 21 and n-type AlGaAs 22 are grown on the semi-insulating substrate 20 in order. An electron conduction layer 23 of a two-dimensional electron gas is formed in the vicinity of the heterojunction interface between the non-doped GaAs 21 and n-type AlGaAs 22. The electron conduction layer 23 provides an electron waveguide 1 and a branch electron waveguide 2 of the quantum effect device.

A manufacturing process of compound semiconductors of GaAs type materials is established to some degree and a good heterojunction interface with extremely low crystal discontinuity can be formed, and thus the scattering of electrons can be decreased on the electron conduction layer 23 of the two-dimensional electron gas. Further, the electron conduction layer 23 of the two-dimensional electron gas is used for the electron waveguide 1 and the branch electron waveguide 2, so that high electron mobility is provided and ballistic electrons can be used in the quantum effect device.

The manufacturing process of each of GaAs and AlGaAs, among compound semiconductors, is very well established and a heterojunction interface having a superior and stable band gap with extremely low crystal discontinuity can be formed, thus scattering of electrons can be substantially decreased on the electron conduction layer 23 of the two-dimensional electron gas. Further, comparatively high electron mobility is provided on the electron conduction layer 23 of the two-dimensional electron gas.

Further, the electron waveguide 1 and the branch electron waveguide 2 are formed on the electron conduction layer 23 of the two-dimensional electron gas in the vicinity of the heterojunction interface between the non-doped GaAs 21 and n-type AlGaAs 22, and they are made on the same horizontal plane. Since the electron waveguide 1 and the branch electron waveguide 2 are formed in one single good crystal layer formed by the semiconductor manufacturing process, namely, in non-doped GaAs 21, the scattering of electrons can be decreased on the electron waveguide 1 and the branch electron waveguide 2, and the ballistic characteristic of electrons can be improved.

Schottky junction structures are made around the electron waveguide 1 and the branch electron waveguide 2 and more particularly on sides for defining the width of the electron waveguide 1 and the width of the branch electron waveguide 2. Each of the Schottky junction structures comprises n-type AlGaAs 22 and a Schottky control electrode 24 disposed on the n-type AlGaAs 22. In the Schottky junction structure, a depletion region 25 can be formed on the side of the n-type AlGaAs 22 from the interface between the n-type AlGaAs 22 and the Schottky control electrode 24 for determining the widths of the electron waveguide 1 and the branch electron waveguide 2. The widths of the electron waveguide 1 and the branch electron waveguide 2 (electron conduction layer 23) are defined by the depletion regions 25 coming into contact with each of the electron waveguide 1 and the branch electron waveguide 2 on a smooth interface rather than by a physical process generating microscopic irregularities. That is, scattering of electrons can be reduced on the electron waveguide 1 and the branch electron waveguide 2.

The source region 3, the first drain region 4, and the second drain region 5 of the quantum effect device are formed with ohmic electrodes 26 of a source electrode, a first drain electrode, and a second drain electrode respectively. Each ohmic electrode 26 comes in direct contact with the top of the n-type AlGaAs 22 and is electrically connected to a contact region (semiconductor region) 27 reaching the semi-insulating substrate 20 from the surface of the n-type AlGaAs 22. For example, impurity ions are introduced by an ion implantation process and the introduced impurity ions are activated, thereby forming the contact regions 27.

The gate region 6 is made of a gate electrode (reflection gate) 28 which is comprised of a Schottky electrode brought into direct contact with the n-type AlGaAs 22 in the area of the electron waveguide 1. The gate electrode 28 is drawn out onto the Schottky electrode 24 around the electron waveguide 1. An insulating layer 29 is formed between the gate electrode 28 and the Schottky electrode 24 for isolation therebetween. An isolation region 30 is formed between the source region 3 and the second drain region 5 and between the first drain region 4 and the second drain region 5. The isolation regions 30 are made of semiconductor regions or insulators and can eliminate a leakage path causing electron leakage.

Embodiment 2:

In a second embodiment of the invention, a branch electron waveguide is branched off at a tilt angle from an electron waveguide in a quantum effect device.

Figure 11:
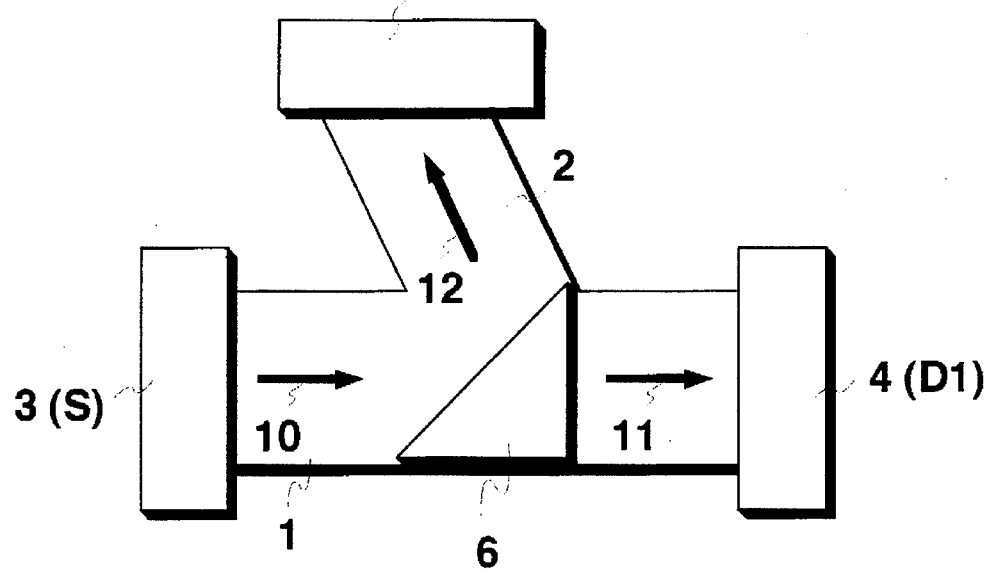
FIG. 11 is a plan view of a quantum effect device according to a second embodiment of the invention.

FIG. 11 is a plan view of a quantum effect device according to the second embodiment of the invention. As shown here, a branch electron waveguide 2 is branched off at a tilt angle from an electron waveguide 1 in the quantum effect device. That is, the branch electron waveguide 2 need not necessarily be perpendicular to the electron waveguide 1 and therefore design freedom of the quantum effect device can be made large without affecting the basic operation characteristics of the quantum effect device.

Further, the branch electron waveguide 2 is branched off towards the side of a source region 3 (electron injection side) at an angle of less than 90 degrees from the electron waveguide 1. The quantum effect device thus formed enables improvement in the current branching ratio when zero bias is applied to a gate region 6, compared with a quantum effect device having the branch electron waveguide 2 branched off towards the side of a first drain region 4 of the electron waveguide 1 at an acute tilt angle.

Embodiment 3

In a third embodiment of the invention, an electron waveguide and a branch electron waveguide are formed on the same vertical plane in a quantum effect device.

Figure 12:
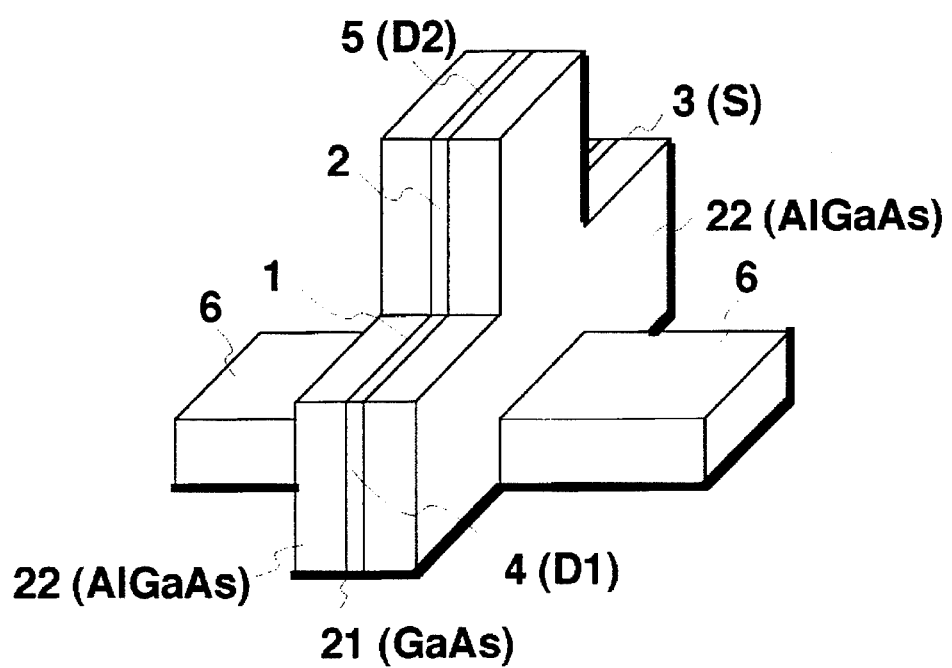
FIG. 12 is a perspective view of a quantum effect device according to a third embodiment of the invention.

FIG. 12 is a perspective view of a quantum effect device according to the third embodiment of the invention. As shown here, an electron waveguide 1 and a branch electron waveguide 2 are formed on the vertical plane in the quantum effect device. That is, both sides of non-doped GaAs 21 formed as a vertical plane are sandwiched between n-type AlGaAs 22 and n-type AlGaAs 22 and an electron conduction layer 23 of a two-dimensional electron gas is formed in the sandwiched non-doped GaAs 21 for providing the electron waveguide 1 and the branch electron waveguide 2.

If the film thickness of non-doped GaAs 21 is set thin, for example, about 10 nm, the non-doped GaAs 21 itself functions as the electron conduction layer 23 of the two-dimensional electron gas. Unlike the structure comprising non-doped GaAs 21 and n-type AlGaAs 22 grown on the semi-insulating layer 20 in order, the special structure having both sides of non-doped GaAs 21 sandwiched between n-type AlGaAs 22 and n-type AlGaAs 22 enables a gate region 6 to be disposed on each side of the electron waveguide 1 and the gate regions 6 on both sides can be used to control an electron flow 10.

Embodiment 4

In a fourth embodiment of the invention, a quantum effect device adopts a quantum wire waveguide structure.

Figure 13:
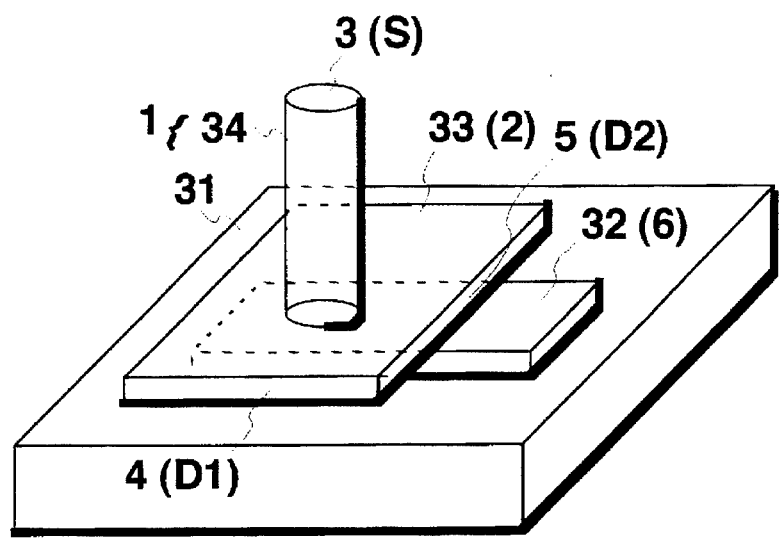
FIG. 13 is a perspective view of a quantum effect device according to a fourth embodiment of the invention.

FIG. 13 is a perspective view of a quantum effect device adopting a quantum wire structure according to the fourth embodiment of the invention. As shown here, the quantum effect device adopting the quantum wire structure comprises a first waveguide 31, a control region 32, a second waveguide 33, and a quantum wire waveguide 34.

The first waveguide 31 provides a waveguide between a gate region 6 and a first drain region 4 of an electron waveguide 1 and is made of a compound semiconductor substrate or a compound semiconductor thin film grown on a substrate. The control region substance 32 provides the gate region 6 and is formed on the first waveguide 31. The second waveguide 33 provides a branch electron waveguide 2 and is formed on the control region 32. The quantum wire waveguide 34 provides a region between a source region 3 and the gate region 6 of the electron waveguide 1 and is formed on the second waveguide 33.

The quantum effect device having the quantum wire structure can be easily provided because it can be formed as the simple structure of connecting the quantum wire waveguide 34 to the second waveguide 33 and drawing out a wire as the quantum wire waveguide 34 in the vertical direction, for example, to the second waveguide 33.

Embodiment 5

In a fifth embodiment of the invention, a quantum effect device comprises a plurality of branch electron waveguides.

Figure 14:
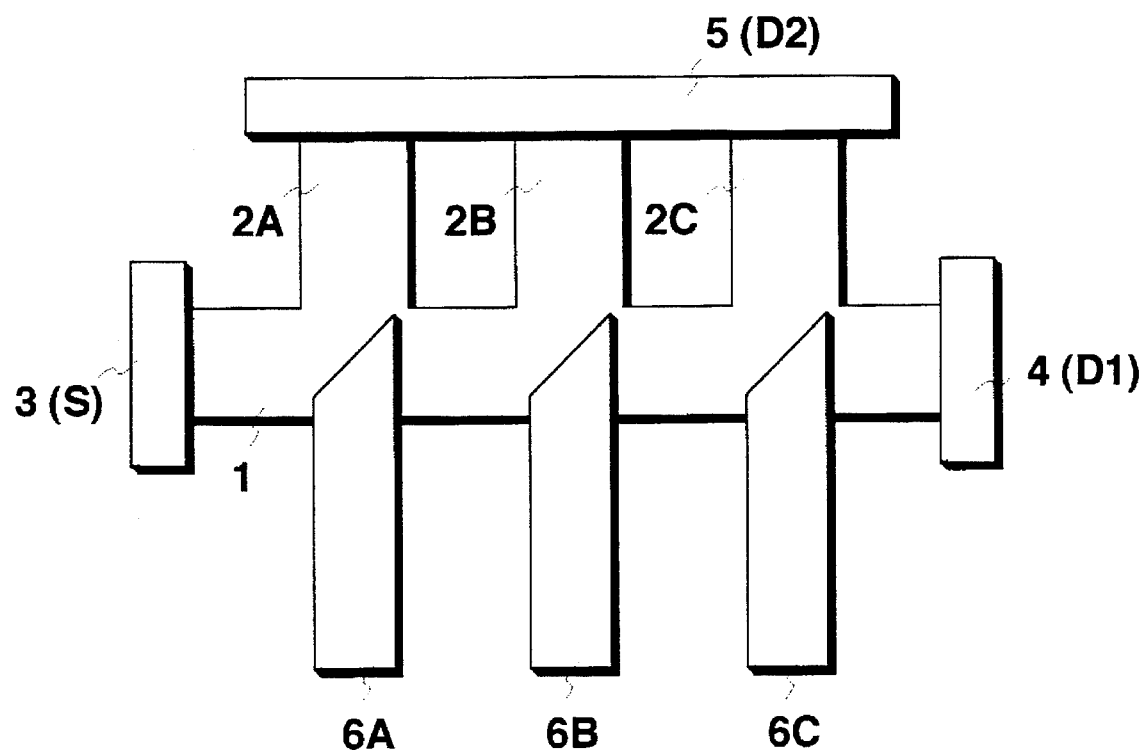
FIG. 14 is a plan view of a quantum effect device according to a fifth embodiment of the invention.

FIG. 14 is a plan view of a quantum effect device according to the fifth embodiment of the invention. As shown here, in the quantum effect device, branch electron waveguides 2 are branched off from an electron waveguide 1 as branch electron waveguides 2A, 2B, and 2C in parallel with each other, and gate regions 6A, 6B, and 6C capable of controlling potential barriers together or separately are formed corresponding to the branch parts of the branch electron waveguides 2A, 2B, and 2C.

In the quantum effect device thus formed, electrons not led into the branch electron waveguide 2A by the quantum-mechanical reflection of a potential barrier and penetrating the potential barrier in the branch part of the branch electron waveguide 2A, namely, in the preceding branch part on the source region 3 side of the electron waveguide 1, are led into the branch electron waveguide 2B by the quantum-mechanical reflection in the following branch part. Likewise, the electrons not led into the branch electron waveguide 2B by the quantum-mechanical reflection of a potential barrier and penetrating the potential barrier in the branch part of the branch electron waveguide 2B are led into the branch electron waveguide 2C by the quantum-mechanical reflection in the following branch part. That is, the total number of electrons emitted from a second drain region 5 can be increased, thus the current branching ratio of the quantum effect device can be improved overall, leading to an Improvement in driving capability. As a result, the quantum effect device enables low voltage operation.

Embodiment 6

In a sixth embodiment of the invention, materials suitable for waveguides of a quantum effect device will be discussed.

FIGS. 15 to 18 are sectional views of waveguides of quantum effect devices according to the sixth embodiment of the invention.

The quantum effect device comprises an electron waveguide 1 and a branch electron waveguide 2 provided by an electron conduction layer 23 of a two-dimensional electron gas formed in the vicinity of a heterojunction interface of a III–V compound semiconductor. On the compound semiconductor, a monocrystalline thin film whose electron density can be controlled to an appropriate value, and which has extremely low crystal discontinuity can be formed, thus the phase breaking time and coherence length required for the operation of the quantum effect device can be sufficiently maintained.

On the other hand, a IV compound semiconductor or silicon does not provide the sufficient coherence length required for the operation at the temperature of liquid nitrogen or higher. Further, metal has properties of high electron density, large rate of inelastic collision between electrons, short phase breaking time, and short coherence length, and thus is not adequate for quantum effect devices using an electron wave property. Metal might be used for quantum effect devices, but needs to be cooled to the very low temperature of liquid helium or less and cannot be used practically. Also, it is difficult to grow a single crystalline thin film and dislocation, crystal discontinuity, or the like frequently occur in the polycrystalline or amorphous condition of metal, causing electrons to scatter. Therefore, metal cannot be used practically. For these reasons, compound semiconductors are used for quantum effect devices.

Figure 15:
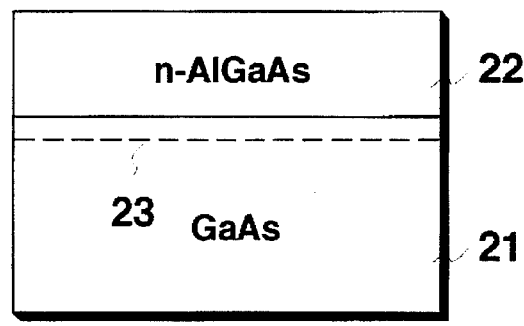
FIG. 15 is a sectional view of a quantum effect device according to a sixth embodiment of the invention.

GaAs (GaAs substrate or thin film) 21 and n-type AlGaAs 22 are used in the quantum effect device shown in FIG. 15. An electron conduction layer 23 of a two-dimensional electron gas is formed in the vicinity of a heterojunction interface between GaAs 21 and n-type AlGaAs 22 for providing an electron waveguide 1 and a branch electron waveguide 2. As described in Embodiment 1 above, the manufacturing process of GaAs type compound semiconductors is very well established and the GaAs type materials compound semiconductors are suitable for quantum effect devices from the points of view of the band gap, mobility, and ease of preparing a crystal in a high temperature operation environment (temperature range from liquid nitrogen temperature to room temperature).

Figure 16:
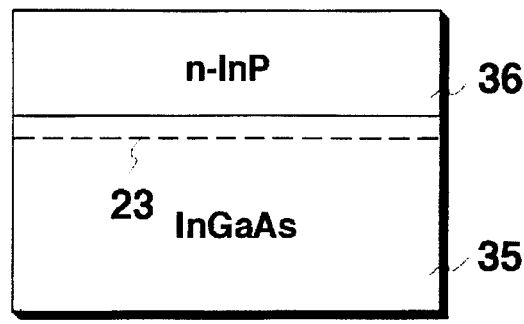
FIG. 16 is a sectional view showing another example of the quantum effect device according to the sixth embodiment o the invention.

InGaAs (InGaAs substrate or thin film) 35 and n-type InP 36 are used in the quantum effect device shown in FIG. 16. An electron conduction layer 23 of a two-dimensional electron gas is formed in the vicinity of a heterojunction interface between InGaAs 35 and n-type InP 36 for providing an electron waveguide 1 and a branch electron waveguide 2. On the heterojunction formed by the InGaAs 35 and the n-type InP 36, appropriate characteristics for quantum effect devices are provided because of lattice matching and a band gap similar to that in the GaAs type compound semiconductors. The manufacturing process of each of InGaAs 35 and n-type InP 36 is very well established and a heterojunction interface having a superior and stable band gap with extremely low crystal discontinuity can be formed, so that the scattering of electrons can be substantially decreased on the electron conduction layer 23 of the two-dimensional electron gas. Further, compared with GaAs type materials compound semiconductors, higher electron mobility is provided on the electron conduction layer 23 of the two-dimensional electron gas.

Figure 17:
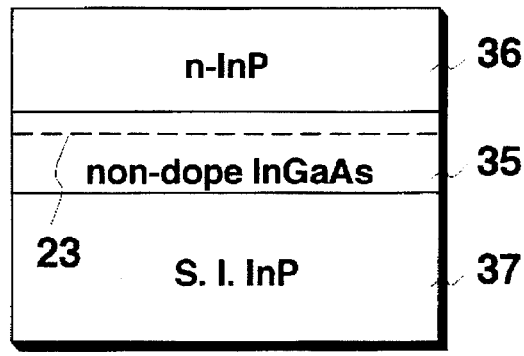
FIG. 17 is a sectional view showing another example of the quantum effect device according to the sixth embodiment of the invention.

Non-doped InGaAs 35 and n-type InP 36 grown in order on a semi-insulating substrate 37 consisting of InP are used in the quantum effect device shown in FIG. 17. An electron conduction layer 23 of a two-dimensional electron gas is formed in the vicinity of a heterojunction interface between non-doped InGaAs 35 and n-type InP 36 for providing an electron waveguide 1 and a branch electron waveguide 2.

Figure 18:
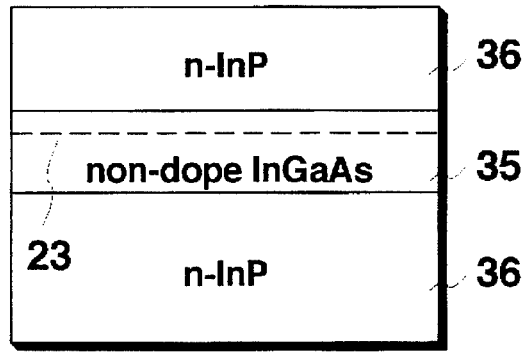
FIG. 18 is a sectional view showing another example of the quantum effect device according to the sixth embodiment of the invention.

As with the quantum effect device described in Embodiment 3 above, non-doped InGaAs 35 and n-type InP 36 between which both sides of the non-doped InGaAs is sandwiched are used in the quantum effect device shown in FIG. 18. In the sixth embodiment, one n-type InP 36 (on the lower side in FIG. 18) is used as a substrate, but basically n-type InP 36 may be formed as a thin film. When the film thickness of non-doped InGaAs 35 of the intermediate layer is thick, an electron conduction layer 23 of a two-dimensional electron gas is formed in the vicinity of a heterojunction interface between non-doped InGaAs 35 and n-type InP 36 on the upper side. When the film thickness of non-doped InGaAs 35 of the intermediate layer is thin, the electron conduction layer 23 of the two-dimensional electron gas itself is substantially made of non-doped InGaAs 35.

Embodiment 7

In a seventh embodiment of the invention, appropriate structures for determining the widths of waveguides of quantum effect devices are discussed.

Figure 19:
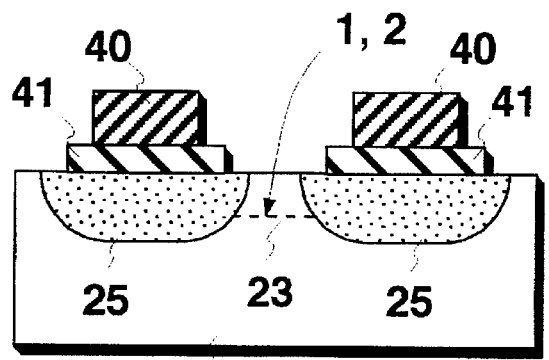
FIG. 19 is a sectional view of a quantum effect device according to a seventh embodiment of the invention.
Figure 20:
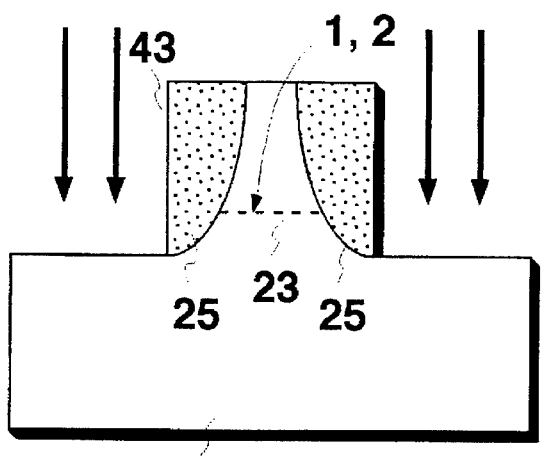
FIG. 20 is a sectional view showing another example of the quantum effect device according to the seventh embodiment of the invention.
Figure 21:
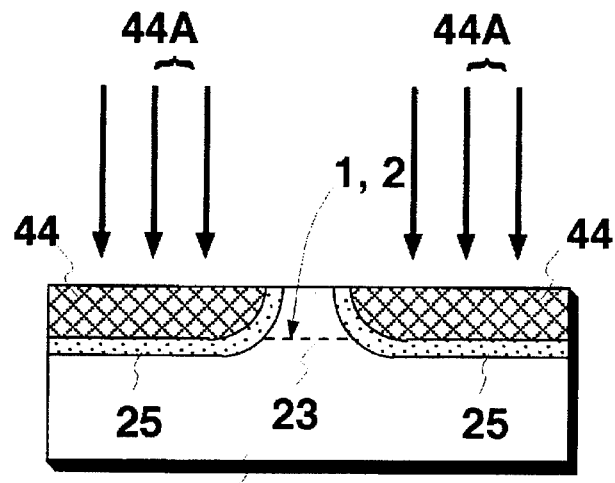
FIG. 21 is a sectional view showing another example of the quantum effect device according to the seventh embodiment of the invention.

FIGS. 19 to 21 are sectional views of waveguides of quantum effect devices according to the seventh embodiment of the invention.

MIS (capacitance) structures are formed around an electron waveguide 1 and a branch electron waveguide 2 in the quantum effect device shown in FIG. 19. More particularly, the MIS (capacitance) structure are disposed along both sides of the electron waveguide 1 and both sides of the branch electron waveguide 2 and depletion regions 25 formed by the MIS (capacitance) structures determine the width of an electron conduction layer 23, which as a result determine the widths of the electron waveguide 1 and the branch electron waveguide 2. In the seventh embodiment, an insulating layer 41 and a capacitance electrode 40 are constructed on n-type AlGaAs 22 in order, (and each MIS capacitance) structure consists of the insulating layer 41, the capacitance electrode 40, and n-type AlGaAs 22 (containing non-doped GaAs 21).

In the quantum effect device thus formed, the widths of the electron waveguide 1 and the branch electron waveguide 2 are defined by the depletion regions 25 which results in a smooth interface with each of the electron waveguide 1 and the branch electron waveguide 2, rather than by a physical process generating microscopic irregularities. As a result, in the quantum effect device, scattering of electrons can be reduced on the electron waveguide 1 and the branch electron waveguide 2.

In the quantum effect device shown in FIG. 20, the surroundings of an electron waveguide 1 and a branch electron waveguide 2 are formed as concave portions and the electron waveguide 1 and the branch electron waveguide 2 are made as convex portions (island regions) 43. The convex portions 43 are formed by using etching so as to generate at least a crystal damage region (etching damage region) on the etched wall face, such as plasma etching or neutral particle beam etching. That is, the widths of the electron waveguide 1 and the branch electron waveguide 2 (width of an electron conduction layer 23) are determined by depletion regions 25 formed by crystal damage regions (etching damage regions) on the wall faces of the concave portions 43.

In the quantum effect device thus formed, the depletion regions 25 formed by the crystal damage regions (etching damage regions) on the wall faces of the concave portions 43 make smooth interfaces with the electron waveguide 1 and the branch electron waveguide 2. Therefore, in the quantum effect device, scattering of electrons can be reduced on the electron waveguide 1 and the branch electron waveguide 2.

In the quantum effect device shown in FIG. 21, Impurities 44A are introduced into the areas surrounding an electron waveguide 1 and a branch electron waveguide 2 for forming crystal damage regions. An Ion Implantation process is used to introduce the impurities 44A. When the crystal damage regions are formed, depletion regions 25 are formed on the side of an electron conduction layer 23 for determining the widths of the electron waveguide 1 and the branch electron waveguide 2.

In the quantum effect device thus formed, the depletion regions 25 formed by the crystal damage regions 44 make smooth interfaces with the electron waveguide 1 and the branch electron waveguide 2. Therefore, in the quantum effect device, scattering of electrons can be reduced on the electron waveguide i and the branch electron waveguide 2. Further, the impurities 44A are introduced to form the crystal damage regions 44 for forming the electron waveguide 1 and the branch electron waveguide 2 rather than the area surrounding the electron waveguide 1 and the branch electron waveguides are processed by a physical process. Therefore, flattening of the surface can be promoted in the quantum effect devices.

Figure 22:
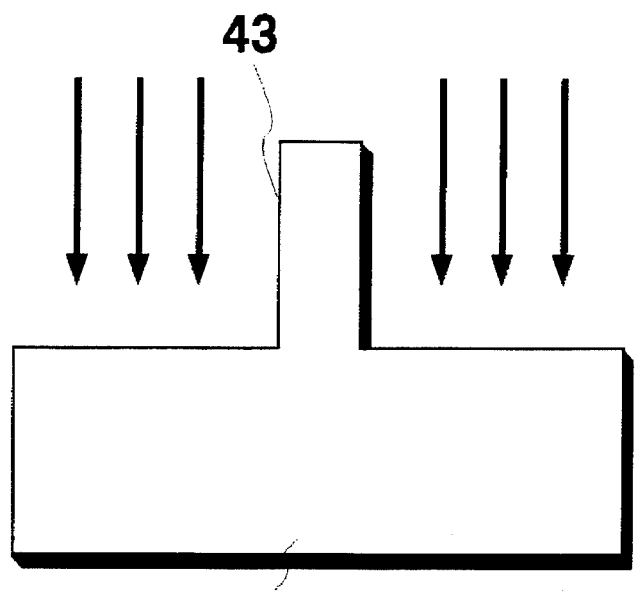
FIG. 22 is a sectional view showing another example of the quantum effect device according to the seventh embodiment of the invention.
Figure 23:
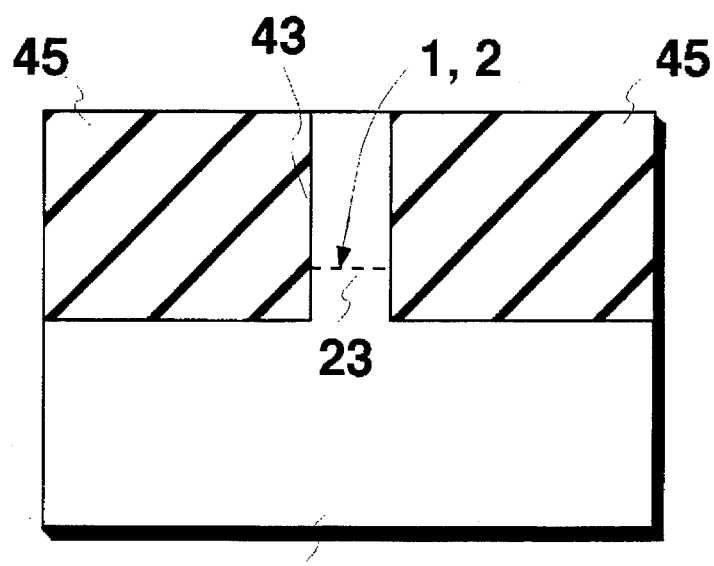
FIG. 23 is a sectional view showing another example of the quantum effect device according to the seventh embodiment of the invention.

FIGS. 22 and 23 are sectional views of waveguides of quantum effect devices showing other examples according to the seventh embodiment of the invention. FIG. 22 is a sectional view in an etching process of quantum effect device and FIG. 23 is a sectional view showing a filling-in process.

In the quantum effect device shown in FIG. 22, concave portions are formed around an electron waveguide 1 and a branch electron waveguide 2. As a result, each of the electron waveguide 1 and the branch electron waveguide 2 is made as a convex portion (island region) 43. The convex portions 43 are formed by using anisotropic etching, such as plasma etching. After this, the concave portions are filled in with filler material 45 in the quantum effect device, as shown in FIG. 23. Basically, material homogeneous to the convex portions 43, for example, compound semiconductor, is used for the filler material 45. After the concave portions are filled in with the filler material 45, normally, annealing capable of recovering at least the crystal damage (etching damage) on the wall faces of the convex portions 43 is performed.

In the quantum effect device thus formed, the exposed wall faces of the electron waveguide 1 and the branch electron waveguide 2 when the concave portions are formed are restored in a form close to that of a perfect lattice by filling in with the filler members 45. Therefore, the crystal surface levels of the wall faces of each of the electron waveguide 1 and the branch electron waveguide 2 are stabilized and electric conductivity can be recovered on the electron waveguide 1 and the branch electron waveguide 2. If material homogeneous to either of the electron waveguide 1 and the branch electron waveguide 2, for example, compound semiconductor, is used as the filler material 45 and furthermore if annealing capable of recovering the crystal damage regions (etching damage regions) is performed after the concave portions are filled in with the compound semiconductors as the filler material 45, recovery of electric conductivity of the electron waveguide 1 and the branch electron waveguide 2 can be further improved.

Embodiment 8

In an eighth embodiment of the invention, other structures of a gate region in a quantum effect device will be described.

Figure 24:
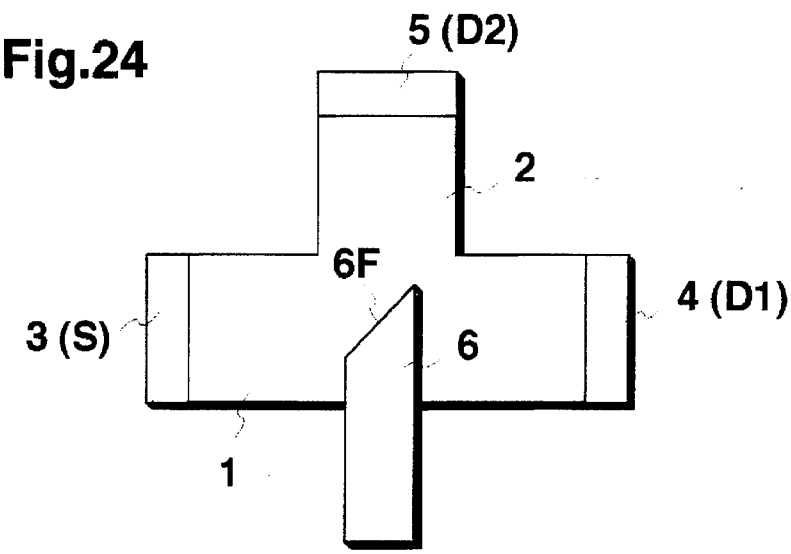
FIG. 24 is a plan view of a quantum effect device according to an eighth embodiment of the invention.
Figure 25:
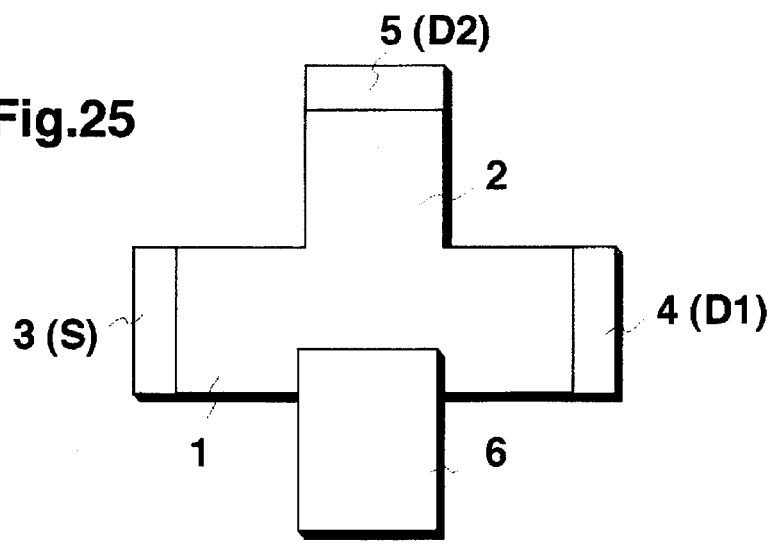
FIG. 25 is a plan view showing another example of the quantum effect device according to the eighth embodiment of the invention.
Figure 26:
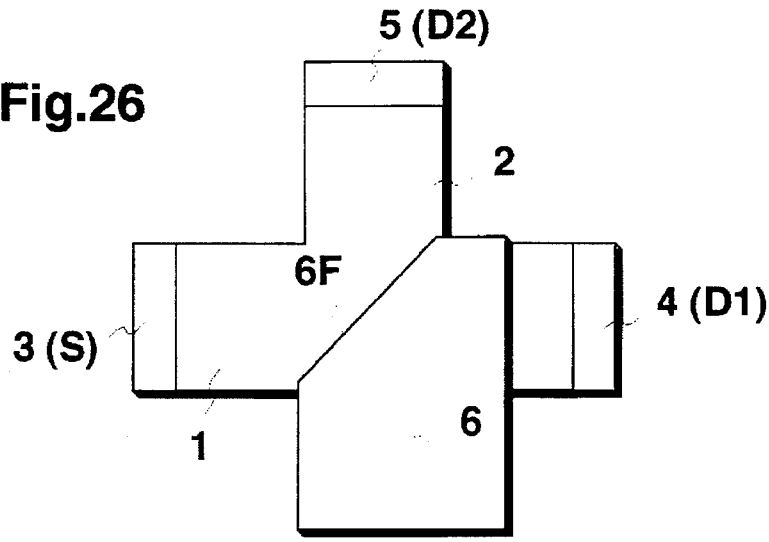
FIG. 26 is a plan view showing another example of the quantum effect device according to the eighth embodiment of the invention.

FIGS. 24 to 26 are plan views of waveguides of quantum effect devices according to the eighth embodiment of the invention.

As with the quantum effect device according to the first embodiment of the invention, the overlap of a gate region 6 with an electron waveguide 1 is formed as a right-angle triangle, the hypotenuse of which constitutes a quantum-mechanical reflection face by utilizing a gate potential barrier in the quantum effect device shown in FIG. 24. However, the size of the gate region 6 shown in FIG. 24 is slightly small and the gate region 6 is made in a shape which is closer to a trapezoid than a triangle.

In the quantum effect device thus formed, the width of the waveguide leading into the branch electron waveguide 2 from the electron waveguide 1 can be sufficiently provided, so that electrons can be made to flow smoothly into the branch electron waveguide 2 from the electron waveguide 1 by the quantum-mechanical reflection of the potential barrier. As a result, the current branching ratio can be improved in the quantum effect device.

The overlap of a gate region 6 with an electron waveguide 1 is formed as a quadrangle in the quantum effect device shown in FIG. 25. Since the length of the gate region 6 can be guaranteed in the longitudinal direction of the electron waveguide 1, electrons passing through the gate region 6 (potential barrier) to the side of a drain region 4 can be decreased when electrons are made to flow into the branch electron waveguide 2 from the electron waveguide 1 by the quantum-mechanical reflection of the potential barrier. As a result, the current branching ratio can be improved in the quantum effect device.

The overlap of a gate region 6 with an electron waveguide 1 is formed as a trapezoid containing a slant side 6F which constitutes a quantum-mechanical reflection face by utilizing a gate potential barrier in the quantum effect device shown in FIG. 26. The part corresponding to the top side of the trapezoid in the gate region 6 has a predetermined length in the longitudinal direction of the electron waveguide 1. In the quantum effect device thus formed, the width of the waveguide leading into the branch electron waveguide 2 from the electron waveguide 1 can be sufficiently provided, so that electrons can be made to flow smoothly into the branch electron waveguide 2 from the electron waveguide 1 by the quantum-mechanical reflection of the potential barrier, as with the quantum effect devices described in the first embodiment and shown in FIG. 24. Further, since the length of the gate region 6 can be guaranteed in the longitudinal direction of the electron waveguide 1, electrons passed through the gate region 6 (potential barrier) to the side of a drain region 4 can be decreased when electrons are made to flow into the branch electron waveguide 2 from the electron waveguide 1 by the quantum-mechanical reflection of the potential barrier. As a result, the current branching ratio can be moreover improved in the quantum effect device.

Embodiment 9

A quantum effect device according to a ninth embodiment of the invention can provide a volt-ampere characteristic similar to a diode characteristic.

Figure 27:
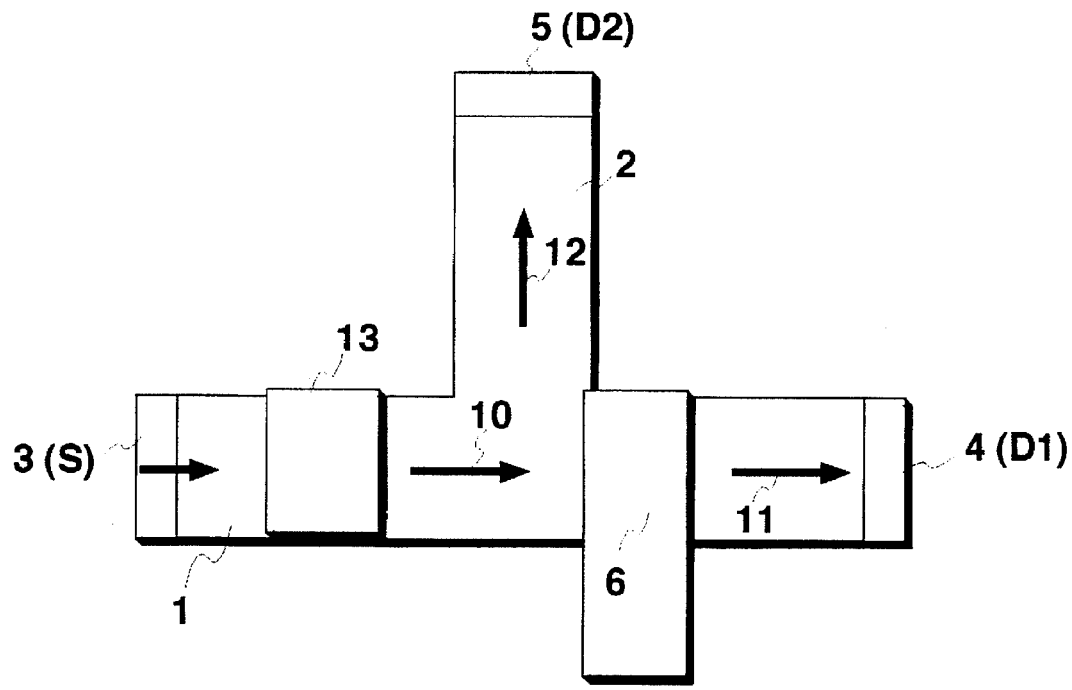
FIG. 27 is a plan view of a quantum effect device according to a ninth embodiment of the invention.
Figure 28:
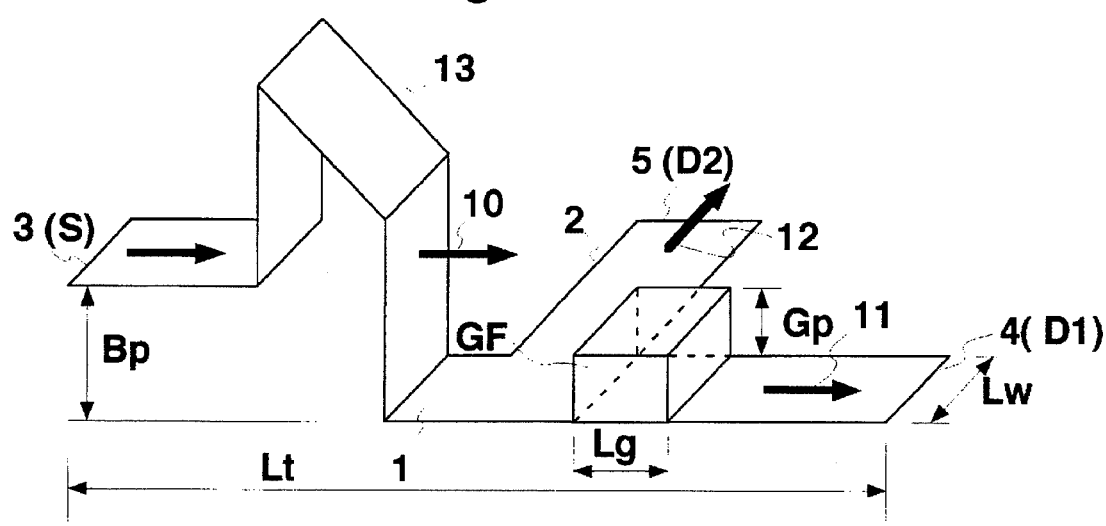
FIG. 28 is a basic structure modeling drawing of the quantum effect device according to the ninth embodiment of the invention.

FIG. 27 is a plan view Illustrating the basic structure of a quantum effect device according to the ninth embodiment of the invention. FIG. 28 is a basic structure modeling drawing representing the relationship between the quantum effect device and potential energy.

A quantum-mechanical reflection face GF formed by a potential barrier generated in a gate region 6 is located on the side of a first drain region 4 of an electron waveguide 1 outside the width of a branch electron waveguide 2 within the electron waveguide 1 in the quantum effect device shown in FIGS. 27 and 28. The quantum-mechanical reflection face GF is set on a plane perpendicular to the direction of the electron flow 10.

Figure 29:
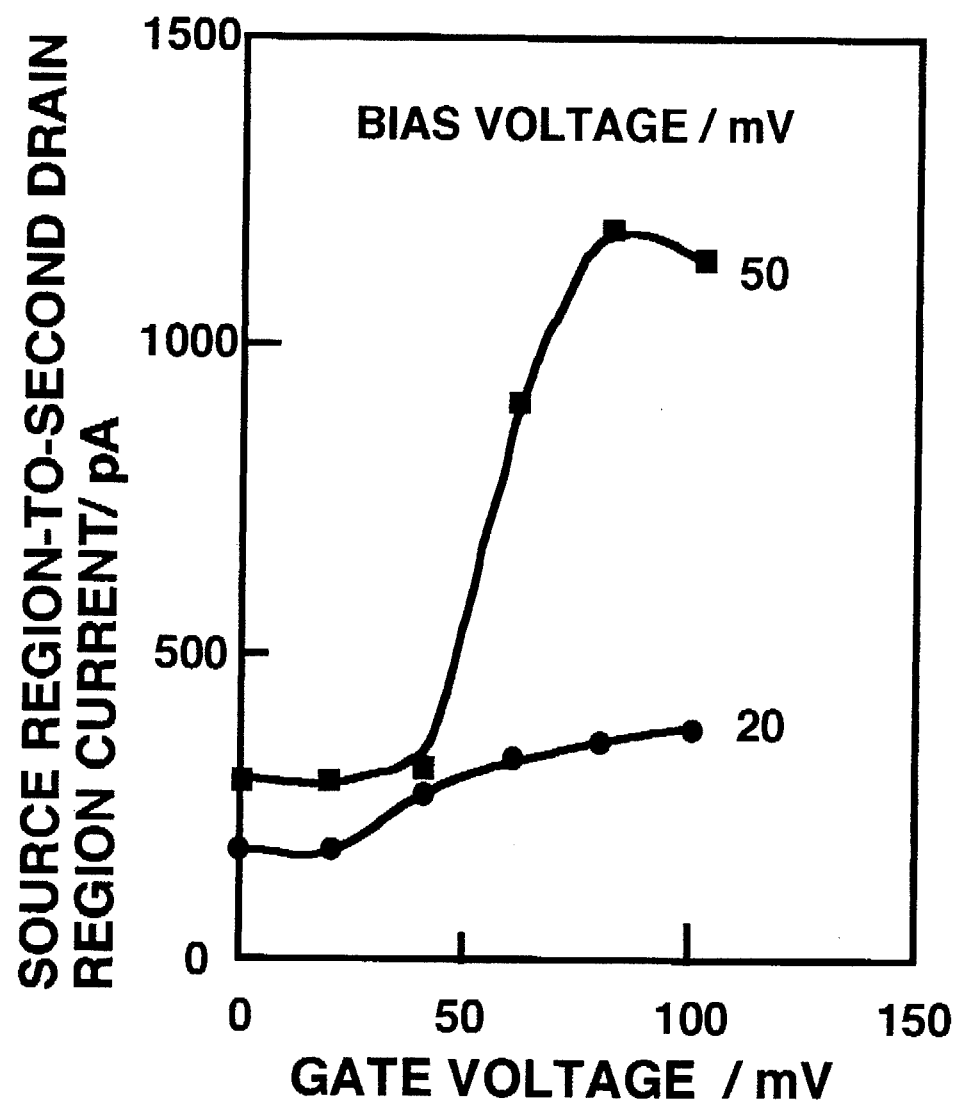
FIG. 29 is a volt-ampere plot of the quantum effect device according to the ninth embodiment of the invention.11

FIG. 29 shows the volt-ampere characteristic (I-V characteristic), obtained by simulation, for the quantum effect device. FIG. 29 shows the source region 3 to second drain region 5 current (source to drain current) values with respect to the voltage (gate voltage) values applied to the gate region 6. As shown here, the quantum effect device provides the characteristic having a region in which current does not increase although gate voltage increases, a nonlinear region in which current increases due to the quantum-mechanical reflection with an increase in gate voltage and a saturation region in which current does not increase although gate voltage increases. In the region in which gate voltage is low, It is considered that there becomes a high probability that electrons once having passed through the branch part of the electron waveguide 1 and the branch electron waveguide 2 will penetrate the potential barrier generated in the gate region 6, and that the electrons will be emitted through the first drain region 4. Therefore, the number of electrons led into the branch electron waveguide 2 decreases. If the source to drain current amount increases, the number of electrons led into the branch electron waveguide 2 can simply be increased.

Thus, in the quantum effect device, electrons once having passed through the branch part of the electron waveguide 1 and the branch electron waveguide 2 reach the quantum-mechanical reflection face formed by the potential barrier generated in the gate region 6. Although electrons reflected on the quantum-mechanical reflection face and led into the branch electron waveguide 2 exist, the number of electrons piercing the potential barrier generated in the gate region, moving straight on the electron waveguide 1, and emitted from the first drain region 4 increases. That is, the quantum effect device provides not only a switching characteristic, but also the volt-ampere characteristic similar to that of a diode. More particularly, it provides the volt-ampere characteristic closer to that of a diode than that of a MOSFET or MESFET.

The invention is not limited to the above-mentioned embodiments and many apparently widely different embodiments of the invention may be made without departing from the spirit and scope thereof.

For example, in the invention, a quantum effect device can be provided by combining at least two or more features of the quantum effect devices according to the first to ninth embodiments thereof.

As described above, firstly, the quantum effect device according to the invention, which uses the quantum-mechanical reflection effect of electrons produced by a gate potential barrier, can shorten the coherence length required for the operation and can operate in a high temperature region.

Secondly, the quantum effect device according to the invention eliminates the need for electron waves to be monochromatic.

Thirdly, the quantum effect device according to the invention can increase operation current and improve the capability of driving a device at the following stage.

Fourthly, the quantum effect device according to the invention is formed with a carrier injection region by a potential barrier between the source region and the gate region of the electron waveguide, thus ballistic carriers can be injected into the control region by tunnel injection and the operation can be speeded up.

What is claimed is:

1. A quantum effect device comprising:

a first region for receiving carriers injected into the device;

second and third regions for emitting carriers from the device;

a first waveguide for guiding carriers from the first region to the second region;

a second waveguide branched off from said first waveguide for guiding carriers from the first waveguide to the third region; and a control region formed at the branch of said first and second waveguides for controlling a potential barrier such that, when said potential barrier is low, said control region permits carriers on said first waveguide to flow to said second region; and when said potential barrier is high, said control region leads carriers from said first waveguide into said second waveguide and to said third region by quantum-mechanical reflection, wherein the length of said first waveguide is set to 100 nm or less and the width of said first waveguide is set to 100 nm or less.

2. The quantum effect device as claimed in claim 1, wherein said second waveguide is branched off at an angle other than a right angle from said first waveguide.

3. The quantum effect device as claimed in claim 1 wherein said second waveguide is branched off toward said first region at an acute angle.

4. The quantum effect device as claimed in claim 1 wherein said second waveguide is branched off perpendicularly to said first waveguide.

5. The quantum effect device as claimed in claim 1, 2 or 4 wherein said first and second waveguides are formed on the same horizontal plane.

6. The quantum effect device as claimed in claim 1, 2 or 4, wherein said first and second waveguides are formed on the same vertical plane.

7. The quantum effect device as claimed in claim 1, 2 or 4 including:

a first waveguide comprised of selected from the group consisting of a substrate and a thin film, for constituting a first portion of said first waveguide from said control region to said second region of said first waveguide;

a control region formed on said first waveguide;

a second waveguide formed on said control region; and a quantum wire waveguide formed on said second waveguide, for constituting a second portion of said first waveguide from said first region to said control region.

8. The quantum effect device as claimed in claim 1, 2 or 4 wherein a plurality of said second waveguides are branched off from said first waveguide in parallel with each other, and wherein said control region is provided at the each branch of said plurality of said second waveguides for separately controlling a potential barrier.

9. The quantum effect device as claimed in claim 1, 2 or 4 wherein said first and second waveguides comprise a compound semiconductor having a heterojunction interface comprising an electron conduction layer of a two-dimensional electron gas.

10. The quantum effect device as claimed in claim 9 wherein said first and second waveguides comprise a lamination of GaAs and AlGaAs layers having a heterojunction interface between them.

11. The quantum effect device as claimed in claim 9 wherein said first and second waveguides comprise a lamination of InGaAs and InP layers having a heterojunction interface between them.

12. The quantum effect device as claimed in claim 9 wherein said first and second waveguides have structures selected from the group consisting of Shottky junction structures and MIS (metal insulator semiconductor) structures around said first and second waveguides, and widths of said first and second waveguides are determined by depletion regions in said structures.

13. The quantum effect device as claimed in claim 9 wherein surroundings of said first and second waveguides are formed as concave portions by etching which generates at least crystal damage regions on etched wall faces of said concave portions, and widths of said first and second waveguides are determined by depletion regions in said crystal damage regions.

14. The quantum effect device as claimed in claim 13 further comprising filler material and wherein said concave portions formed around said first and second waveguides are filled in with said filler material.

15. The quantum effect device as claimed in claim 9 wherein said first and second waveguides have crystal damage regions formed around said first and second waveguides by injecting impurities, and the widths of said first and second waveguides are determined by depletion regions in said crystal damage regions.

16. The quantum effect device as claimed in claim 1, 2 or 4 wherein said control region has an overlap region with said first waveguide, which is formed as a right angle triangle having a hypotenuse which constitutes a quantum-mechanical reflection face by utilizing the potential barrier.

17. The quantum effect device as claimed in claim 1, 2 or 4 wherein said control region has an overlap region with said first waveguide, which is formed as a quadrangle.

18. The quantum effect device as claimed in claim 1, 2 or 4 wherein said control region has an overlap region with said first waveguide, which is formed as a trapezoid having a slant side which constitute a quantum-mechanical reflection face by utilizing the potential barrier.

19. The quantum effect device as claimed in claim 1, 2 or 4 wherein said control region has a quantum-mechanical reflection face by utilizing the potential barrier, which is disposed within the width of said second waveguide on said first waveguide.

20. The quantum effect device as claimed in claim 1, 2 or 4 wherein said control region has a quantum-mechanical reflection face by utilizing the potential barrier, which is disposed on a side of said second region of said first waveguide outside a width of said second waveguide on said first waveguide.

21. The quantum effect device as claimed in claim 1, 2 or 4 wherein said carriers which are injected into said control region are ballistic carriers.

22. The quantum effect device as claimed in claim 1, 2 or 4 wherein said first waveguide has a carrier injection region between said first region and said control region, said carrier injection region is comprised of a structure selected from the group consisting of a single potential barrier structure and a resonant tunneling structure for injecting ballistic carriers into said control region by tunnel injection.

23. A quantum effect device comprising:

a first region for receiving carriers injected into the device;

second and third regions for emitting carriers from the device;

a first waveguide for guiding carriers from the first region to the second region, wherein the length of said first waveguide is 100 nm or less and the width of said first waveguide is 100 nm or less;

a second waveguide branched off from said first waveguide for guiding carriers from the first waveguide to the third region;

a control region formed at the branch of said first and second waveguides for controlling a potential barrier; and a carrier injection region between said first region and said control region;

wherein when said potential barrier is low, said control region permits carriers on said first waveguide to flow to said second region; when said potential barrier is high, said control region leads carriers from said first waveguide into said second waveguide and to said third region by quantum-mechanical reflection; and said carrier injection region is comprised of a structure selected from the group consisting of a single potential barrier structure and a resonant tunneling structure for injecting ballistic carriers into said control region by tunnel injection.

24. The quantum effect device as claimed in claim 23 wherein said carriers which are injected into said control region are ballistic carriers.

25. A quantum effect device comprising:

receiving means for receiving carriers injected into the device;

first and second emitting means for emitting carriers from the device;

a first waveguide means for guiding carriers from the receiving means to the first emitting means, wherein the length of said first waveguide means is 100 nm or less and the width of said first waveguide means is 100 nm or less;

a second waveguide means for guiding carriers from the first waveguide to the second emitting means; and a control means for controlling a potential barrier such that when said potential barrier is low, said control means permits carriers on said first waveguide means to flow to said first emitting means; when said potential barrier is high, said control means leads carriers from said first waveguide means into said second waveguide means and to said second emitting means by quantum-mechanical reflection.

26. A quantum effect device comprising:

receiving means for receiving carriers injected into the device;

first and second emitting means for emitting carriers from the device;

a first waveguide means for guiding carriers from the receiving means to the first emitting means, wherein the length of said first waveguide means is 100 nm or less and the width of said first waveguide means is 100 nm or less;

a second waveguide means for guiding carriers from the first waveguide to the second emitting means;

a control means for controlling a potential barrier; and a carrier injection means for accelerating said carriers as ballistic carriers and injecting them into said control means by tunnel injection;

wherein when said potential barrier is low, said control means permits carriers on said first waveguide means to flow to said first emitting means; when said potential barrier is high, said control means leads carriers from said first waveguide means into said second waveguide means and to said second emitting means by quantum-mechanical reflection.

27. A method of diverting a flow of carriers, comprising:

injecting carriers into a first region of a first waveguide for guiding said carriers to a second region, wherein the length of said first waveguide is 100 nm or less and the width of said first waveguide is 100 nm or less;

controlling a potential barrier to divert carriers by quantum-mechanical reflection to a second waveguide branched off from said first waveguide for guiding said carriers from the first waveguide to a third region; and emitting said carriers from one of said second region and said third region.

28. A method of diverting a flow of carriers, comprising:

injecting carriers into a first region of a first waveguide for guiding said carriers to a second region, wherein the length of said first waveguide is 100 nm or less and the width of said first waveguide is 100 nm or less;

accelerating said carriers as ballistic carriers by a structure selected from the group consisting of a single potential barrier structure and a resonant tunneling structure;

controlling a potential barrier to divert carriers by quantum-mechanical reflection to a second waveguide branched off from said first waveguide for guiding said carriers from the first waveguide to a third region; and emitting said carriers from one of said second region and said third region.

* * * * *